United States Patent
Van Eijk et al.

(10) Patent No.: US 11,121,115 B2
(45) Date of Patent: Sep. 14, 2021

(54) Y-THETA TABLE FOR SEMICONDUCTOR EQUIPMENT

(71) Applicant: ASM Technology Singapore Pte Ltd, Singapore (SG)

(72) Inventors: Jan Van Eijk, Eindhoven (NL); Ronald Maarten Schneider, Eindhoven (NL); Jasper Anne Frido Marikus Simons, Eindhoven (NL); Timotheus Hubertus Christiaan Groothuijsen, Eindhoven (NL)

(73) Assignee: ASM TECHNOLOGY SINGAPORE PTE LTD., Singapore (SG)

( * ) Notice: Subject to any disclaimer, the term of this patent is extended or adjusted under 35 U.S.C. 154(b) by 289 days.

(21) Appl. No.: 16/136,466

(22) Filed: Sep. 20, 2018

(65) Prior Publication Data
US 2020/0098722 A1    Mar. 26, 2020

(51) Int. Cl.
*B23K 20/10*    (2006.01)
*H01L 23/00*    (2006.01)
*H01L 21/68*    (2006.01)

(52) U.S. Cl.
CPC ............. *H01L 24/78* (2013.01); *B23K 20/10* (2013.01); *H01L 21/68* (2013.01); *H01L 2224/78803* (2013.01)

(58) Field of Classification Search
CPC . H01L 2924/00014; H01L 2224/45099; H01L 21/67138; H01L 21/68; H01L 2224/78301; H01L 2224/78801; H01L 2224/78803; H01L 2224/78821; H01L 24/78
See application file for complete search history.

(56) References Cited

U.S. PATENT DOCUMENTS

| | | | | |
|---|---|---|---|---|
| 5,182,967 A | * | 2/1993 | Yoshizawa | B30B 1/02 74/834 |
| 5,477,743 A | * | 12/1995 | Yanagisawa | B23Q 5/34 108/143 |
| 6,025,689 A | * | 2/2000 | Prentice | B23Q 1/4852 318/625 |
| 6,398,098 B1 | * | 6/2002 | Kada | B23K 20/004 228/1.1 |
| 6,460,751 B1 | | 10/2002 | Thürlemann | 228/4.5 |
| 7,320,423 B2 | * | 1/2008 | Suresh | B23K 20/004 228/4.5 |
| 7,898,204 B2 | * | 3/2011 | Hunter | G03F 7/70758 318/568.11 |

(Continued)

*Primary Examiner* — Erin B Saad
*Assistant Examiner* — Carlos J Gamino
(74) *Attorney, Agent, or Firm* — Ostrolenk Faber LLP

(57) ABSTRACT

A positioning table, for example for a wire bonder has first and second arms, each of said first and second arms being independently drivable linearly along a first axis, and a stage that is engaged with both the first and second arms. The stage engages with each of the first and second arms via a respective engagement mechanism such that the stage is movable both linearly along the first axis, and rotatable about a rotary axis coincident with a center-point of the stage, the rotary axis being orthogonal to the first axis. Each engagement mechanism is configured to permit a respective distance between the center-point of the stage and an end of each of the first and second arms to vary during movement of an arm along the first axis.

14 Claims, 7 Drawing Sheets

(56) References Cited

U.S. PATENT DOCUMENTS

| | | | |
|---|---|---|---|
| 8,256,658 B2 | 9/2012 | Ou et al. | 228/4.5 |
| 2004/0165172 A1* | 8/2004 | Poon | G03F 7/70766 |
| | | | 355/72 |
| 2005/0146169 A1* | 7/2005 | Thallner | G03F 7/70716 |
| | | | 297/158.4 |
| 2006/0060631 A1* | 3/2006 | Frasch | B23K 37/0282 |
| | | | 228/4.5 |
| 2016/0169355 A1* | 6/2016 | Takanami | F16H 21/46 |
| | | | 156/538 |

* cited by examiner

Y-THETA TABLE FOR SEMICONDUCTOR EQUIPMENT

This invention relates to a positioning table for use in semiconductor equipment, and wire bonders.

BACKGROUND AND PRIOR ART

Current wire bonders typically have bondheads comprising rocker arms that rotate a bonding tool up and down about a horizontal axis with a small angular stroke. The angular stroke of the rocker arm positions the bonding tool along a vertical Z-axis. The bondhead is mounted on mutually orthogonal X and Y motion stages of an XY table in order to position the bonding tool in the X and Y axes on a horizontal plane. As a specific example, a current wire bonder may have a bondhead housing mounted on an XY table, which comprises an X-stage to linearly drive the bondhead body along an X-axis and a Y-stage to linearly drive the bondhead body along a Y-axis. The XY table may be guided by cross-roller bearings, which may be actuated by decoupled linear actuators, which often have their own linear bearings. However, this type of arrangement leads to rather heavy XY stages that require significant actuating forces to achieve high accelerations.

The speed of wire bonding machines has increased year by year. This has resulted in higher force (and power) requirements from the direct drive motors. Since one stage (typically the X-stage) carries the other stage (typically the Y-stage) which in turn carries the bondhead including the Z-stage, it is the X-stage which has to move the largest mass at high accelerations. This makes the X-motor the bulkiest component and also results in large amounts of heat being dissipated by the X-motor during wire bonding operations. As the maximum acceleration of a linear motor is limited, the addition of the mass of the bondhead and Y-stage will put a limit on the achievable acceleration, and thus the output.

Due to higher speeds of the XY table, which in turn require higher accelerations, the vibrations generated by motion of the moving mass have also increased considerably. These vibrations are transmitted to the work-holder which holds the substrate or carrier being bonded, thus adversely affecting bond-placement accuracy on the same. Since the X-stage has to move the largest mass, the vibrations created by the X-stage have the highest magnitudes.

Another observation is that the linear bearings of the X-stage are the worst stressed, due to high preloading for high stiffness and also due to the high moment loading, resulting from the offset between an actuating X-force and the shifting centre of gravity of the mass carried on it that is moving in the Y-direction.

With a view to overcoming some of the above problems, U.S. Pat. No. 6,460,751 entitled "Bondhead for a Wire Bonder" describes a wire bonding apparatus in which the linear X-stage has been altogether eliminated. Instead a rocker-arm rotary stage is mounted on a vertical axis rotary stage. The rotary stage uses air bearings and is driven by a direct drive motor. The rotary stage, with a vertical rotary axis, is mounted onto the linear Y-stage. Such a rotary stage in effect replaces the X-stage but does not impart purely linear motion in the X-direction to the bonding tool. Since the motion of the bonding tool is rotary, it has an X-direction component as well as a Y-direction component. The Y-direction component can be compensated for by the linear Y-motion imparted by the Y-stage.

Although this design is meant to solve the aforementioned problems associated with the conventional X-stage, it has its own limitations. Firstly, since the total angular travel range is relatively large (+/−15 degrees), the torque that is required of the direct drive motor is substantial, with the result that the direct drive motor cannot be made very small and compact. Furthermore, the use of air bearings places very high demands on the precision of the manufactured parts and their assembly. It also takes up quite considerable space. Being relatively heavy, it increases the loading on the Y-stage which may then begin to face problems similar to the ones mentioned above for the conventional X-stage. Air-bearings also consume copious amount of compressed air even when the bonder is not bonding, thus adding to the running costs.

Another similar prior art that may be mentioned is U.S. Pat. No. 8,256,658 entitled "Wire Bonding Apparatus Comprising Rotary Positioning Stage".

The present invention seeks to overcome the aforesaid problems, and provide a Y-θ table for semiconductor equipment, in particular for a wire bonder.

In accordance with the present invention, the Yθ stage is connected to driving arms using respective flexure pivots to seek to achieve this aim.

SUMMARY OF THE INVENTION

In accordance with a first aspect of the present invention there is provided a positioning table for use in semiconductor equipment, comprising:

first and second arms, each of said first and second arms being independently drivable with a movement component along a direction parallel to a first axis; and a stage, engaged with both the first and second arms;

wherein the stage engages with each of the first and second arms via a respective engagement mechanism such that the stage is movable both linearly in a direction parallel to the first axis, and rotatably about a rotary axis being substantially orthogonal to the first axis.

In accordance with a second aspect of the present invention there is provided a wire bonder comprising the table of the first aspect, and a bondhead mounted on the stage of the table.

In accordance with a third aspect of the present invention there is provided a wire bonder comprising:

first and second arms, each of said first and second arms being independently drivable along a direction parallel to a first axis; and a stage, engaged with both the first and second arms;

wherein the stage engages with each of the first and second arms via a respective engagement mechanism such that the stage is movable both linearly parallel to the first axis, and rotatably about a rotary axis being substantially orthogonal to the first axis, each engagement mechanism being configured to permit a respective distance between the stage and an end of each of the first and second arms to vary during driving of an arm along the direction parallel to the first axis.

The engagement mechanisms, which may preferably comprise hinges, fully determine the position of the stage in all six degrees of freedom, and are configured to permit rotation of the stage relative to the arms, or to linear motors driving the arms, in such a way that a point A of the stage through which the rotary (Z) axis passes will move along the first (Y) axis as $Y_A \theta = \theta * R$, where R is a distance between a center of the engagement mechanism and point A, and θ (in radians)$=(Y_1 - Y_2)/2R$, where $Y_1$ and $Y_2$ are the respective movements of the two arms in a direction parallel to the Y-axis.

Other specific aspects and features of the present invention are set out in the accompanying claims.

BRIEF DESCRIPTION OF THE DRAWINGS

The invention will now be described with reference to the accompanying drawings (not to scale), in which.

DETAILED DESCRIPTION OF THE PREFERRED EMBODIMENTS OF THE INVENTION

Figure 1:
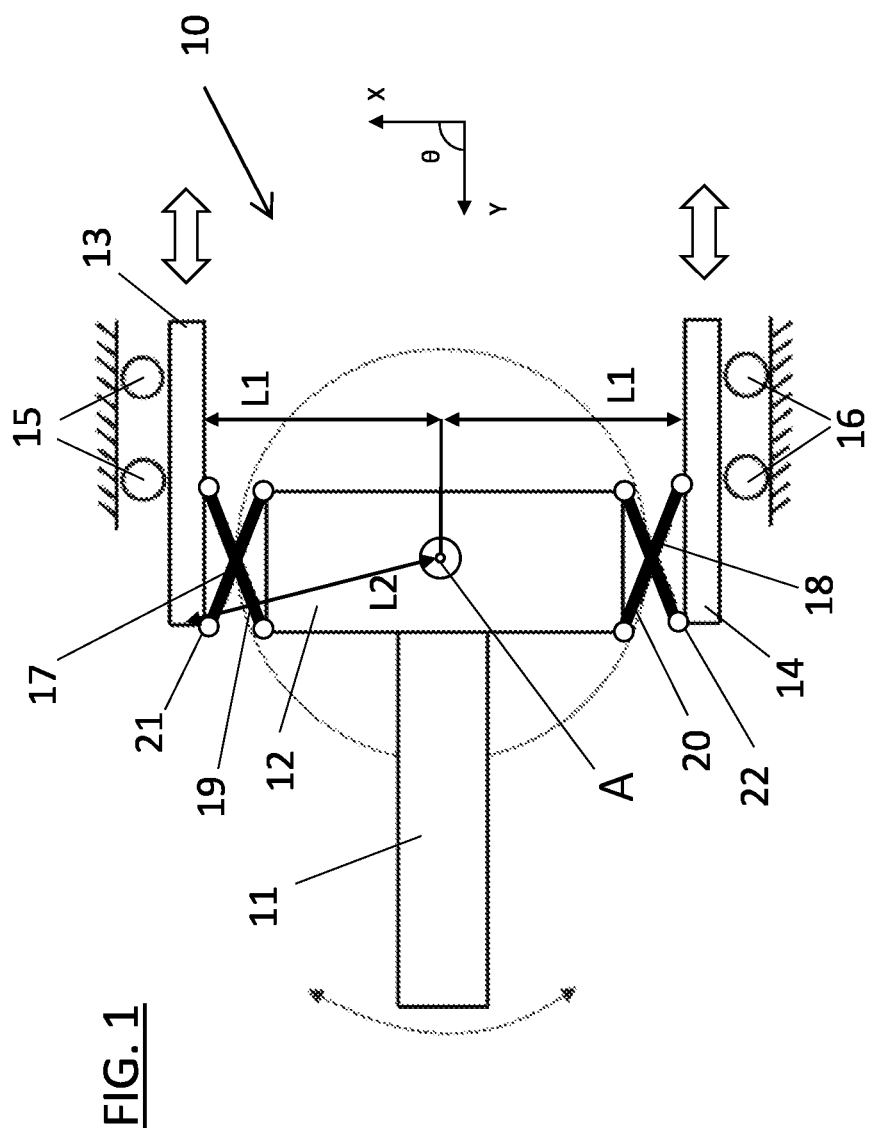
FIG. 1 schematically shows a Yθ table from above in accordance with an embodiment of the present invention.

A first embodiment of the present invention is schematically shown in FIG. 1. A wire bonder table 10 is shown from above, i.e. looking down at table 1 along a Z-axis orthogonal to the X-Y plane. An elongate bondhead 11 is mounted onto a Yθ stage 12, which is connected to first and second arms 13, 14, in this embodiment at diametrically opposed sections of the stage. In this embodiment, the stage 12 is shown as being of substantially rectangular form, but in alternative embodiments may be of various shapes. An arbitrary point A is shown as being coincident with the rotary Z-axis. Each of the first and second arms 13, 14 are independently drivable along the Y-axis by means of respective first and second actuators (not shown), for example linear actuators, or rotary actuators acting on a toothed rack (not shown) of the respective arm. Bearings 15, 16 respectively guide the arms 13, 14.

The stage 12 is connected to each arm 13, 14 via a respective hinge 17, 18. Each hinge 17, 18 is formed as a four-bar linkage, having first and second beams 19, 20, each of the first and second beams 19, 20 being connected at a first end thereof to an arm 13, 14, and at a second, distal end thereof to the stage 12. The first and second beams 19, 20 of each hinge 17, 18 are arranged in a crossed configuration, such that the first and second beams 19, 20 are non-parallel and have adjacent, overlying portions, which as shown are proximate the centre of each beam 19, 20. These portions do not contact each other, to avoid friction between the beams 19, 20.

Each beam 19, 20 comprises a non-flexible rigid rod, and is connected between the respective arm 13, 14 and the stage 12 via a discrete, respective pivot 21, 22 at the ends thereof.

The length of the individual linkages and the angle between the linkages define the movement of the Z-axis during rotation of the stage 12, and need to be chosen carefully to ensure optimum performance. The pivots 21, 22 can be formed in various ways, for example as flexure cross-pivots, ball bearings, elastic/rubber material, or metal flexures such as leaf-springs.

This form of hinge has an advantage that the linkages have a relatively high stiffness both along the Y driving direction and the Z direction, and so are capable of supporting and driving a relatively heavy stage 12.

In the position shown in FIG. 1, the shortest distance between point A, which here is coincident with the rotary (Z) axis, and each arm 13, 14 is L1, which lies normal to the length of the arms 13, 14, so that the stage is located substantially equally between the two arms 13, 14, which arrangement may be achieved by making hinges 17, 18 identical. Additionally, the distance between point A and an end of an arm (in this case arm 13) is shown as being of length L2.

During operation, the stage 12 is moved along the Y-axis when the first and second arms 13, 14 are driven to create a net movement of the arms along the Y-axis, for example if they are both driven in the same direction along the Y-axis. The stage 12 is rotated about a Z-axis substantially orthogonal to the Y-axis when the arms 13, 14 are driven at different velocities along the Y-axis. These linear and rotational movements may be superposed, for example if the arms 13, 14 are both driven in the positive Y direction, but one arm 14 travels faster than the other arm 13, then the stage 12 will both move in the positive Y direction and be rotated clockwise by an angle θ. In this case, it should be noted of course that the point A, and also the axis of rotation, will be translated along the Y direction.

Figure 2:
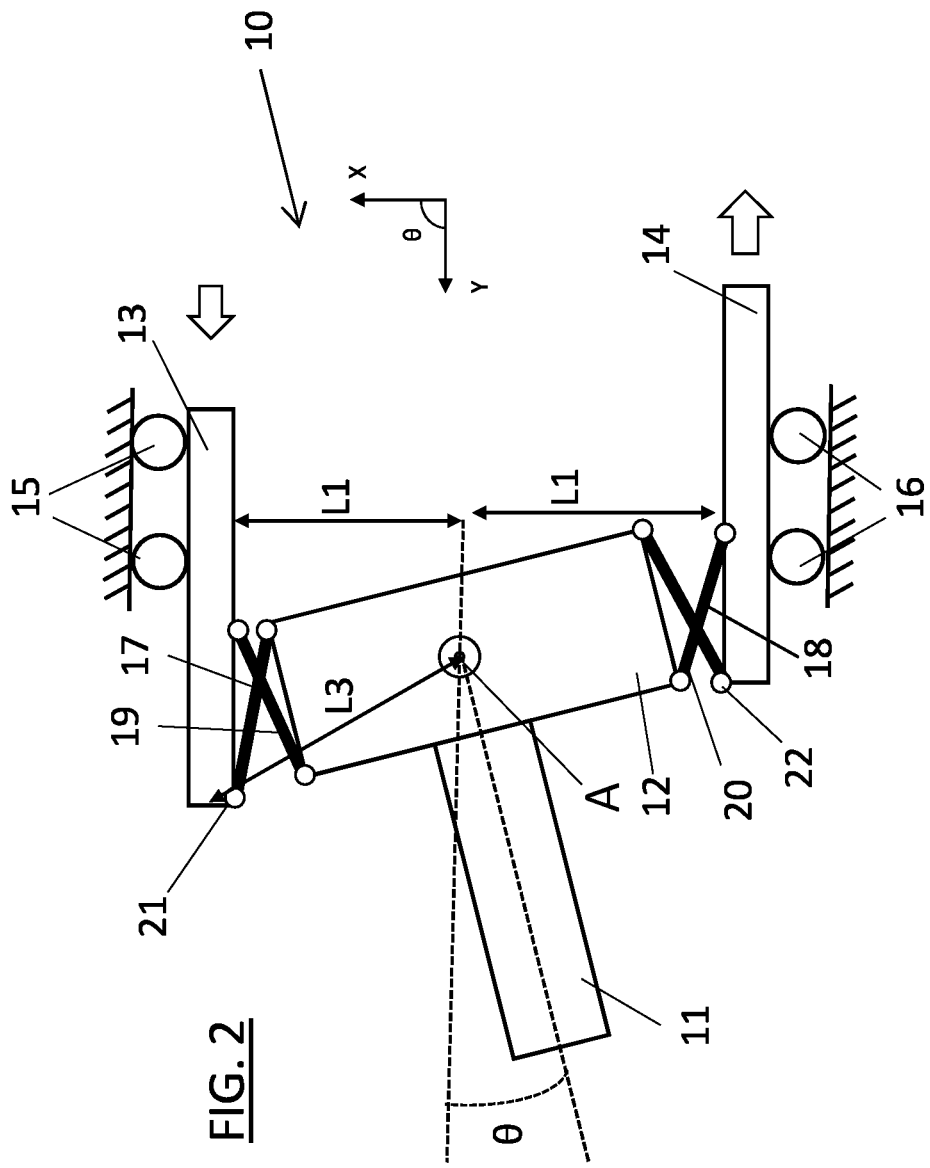
FIG. 2 schematically shows the Yθ table of FIG. 1 in a rotated position.

FIG. 2 shows the table 10 of FIG. 1 in a rotated position. For simplicity, in this case, the arms 13, 14 have each been driven the same distance but in opposite directions along the Y-axis. This results in pure rotation of the stage 12 by an angle θ about the Z-axis, with no translational motion. Firstly, it will be noted that the shortest distance between the Z-axis and each arm 13, 14 remains L1, normal to the length of the arms 13, 14, so that the stage remains located substantially equally between the two arms 13, 14. Secondly, it will be noted that the distance between the Z-axis and an end of an arm (in this case arm 13) is now of length L3, where L3 is greater than L2. It will be seen that this extension avoids placing unacceptable stresses on the arms 13, 14 during rotation.

Figure 3:
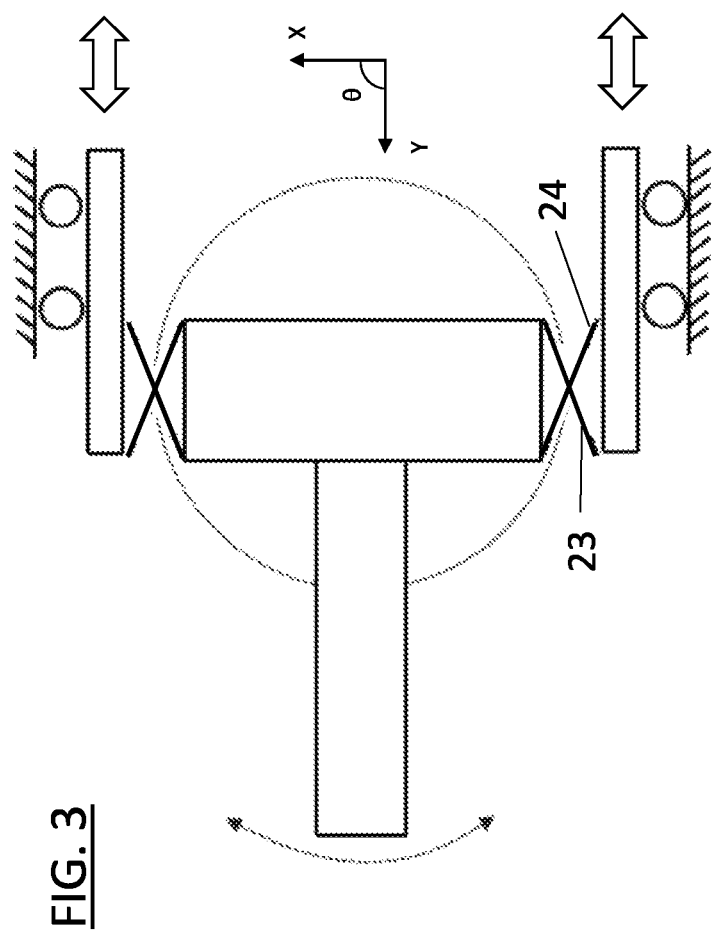
FIG. 3 schematically shows a Yθ table from above in accordance with a second embodiment of the present invention.
Figure 4:
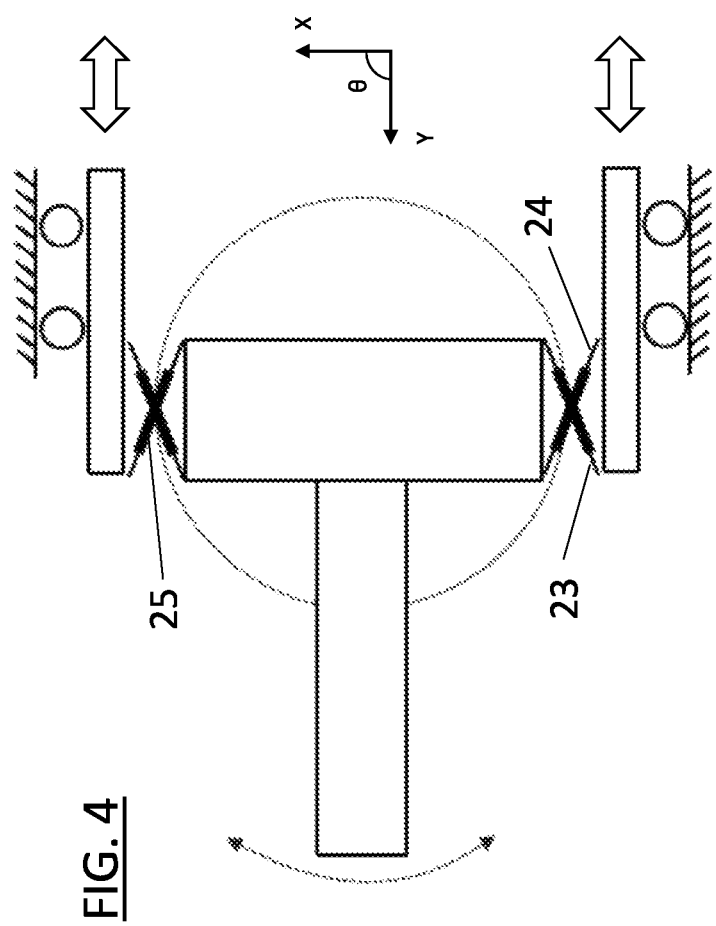
FIG. 4 schematically shows a Yθ table from above in accordance with a third embodiment of the present invention.

Alternative embodiments of the present invention, in which hinges comprising cross-pivot flexures are employed, are schematically shown in FIGS. 3 and 4, which are of similar views to that of FIG. 1. The numbering system adopted in FIG. 1 will be retained for like components where possible. In all these embodiments, the hinges perform similar functions as with the previous embodiment.

In FIG. 3, flexure pivots are used in which each beam comprises a flexure element such as leaf-springs 23, 24. The leaf-springs 23, 24 may be formed from, materials with a high tensile stress or fatigue stress, for example titanium or steel (e.g. Stavax/Tool steel), or super-elastic materials or fiber-reinforced composites such as carbon-fiber plastics. This embodiment has advantages that leaf-springs are accurate (i.e. reproducible, no friction), wear-free, light and low-cost. The thin and flexible nature of the leaf-springs 23, 24 means that discrete pivots are not required (in contrast to the embodiment shown in FIG. 1).

FIG. 4 shows a refinement of the embodiment of FIG. 3, in which each leaf-spring 23, 24 comprises a reinforcement element 25 located at a midsection of the respective leaf-spring 23, 24. Suitable reinforcement elements 25 may comprise sleeves or supports of flexible material, which may have a higher rigidity than the material of the leaf-spring 23, 24, so that the rigidity of the respective leaf-spring 23, 24 is increased. Alternatively, the reinforcement elements may comprise thicker portions of the leaf-springs 23, 24 themselves. This refinement has advantages over the embodiment shown in FIG. 3 in that the stiffness in the Y, X, Z, Rx and Ry directions is significantly higher, while the Rz stiffness only marginally increases, and the variation of the stiffness during rotation of the mechanism is less.

Figure 5:
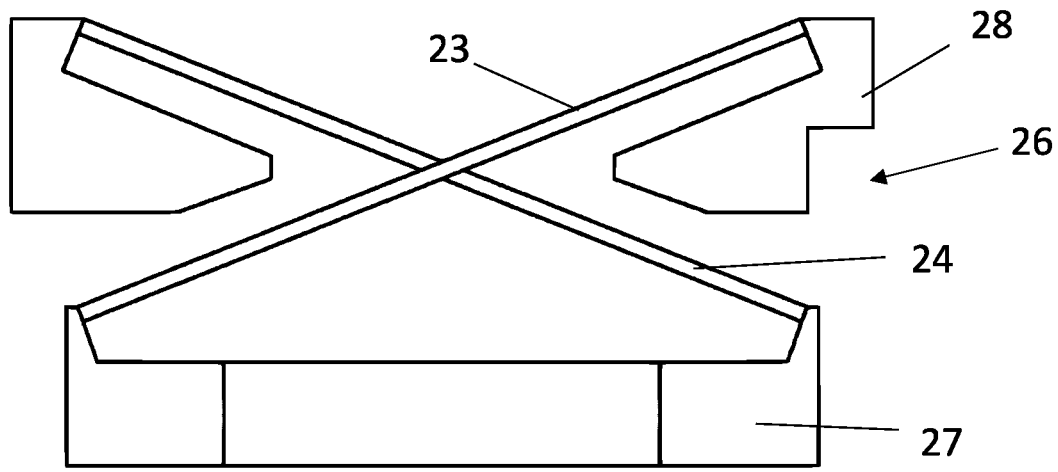
FIG. 5 schematically shows a sectional view of the cross-pivot flexure of FIG. 3.

FIG. 5 schematically shows a sectional view of a cross-pivot flexure 26 of FIG. 3. The leaf-springs 23, 24 are connected by a base 27 which is attached to an arm in use. The distal ends of leaf-springs 23, 24 are provided with mounting elements 28, for attachment to the stage 12. It should be noted that the crossing proximate the center of the leaf-springs 23, 24 is not connected.

Figure 6:
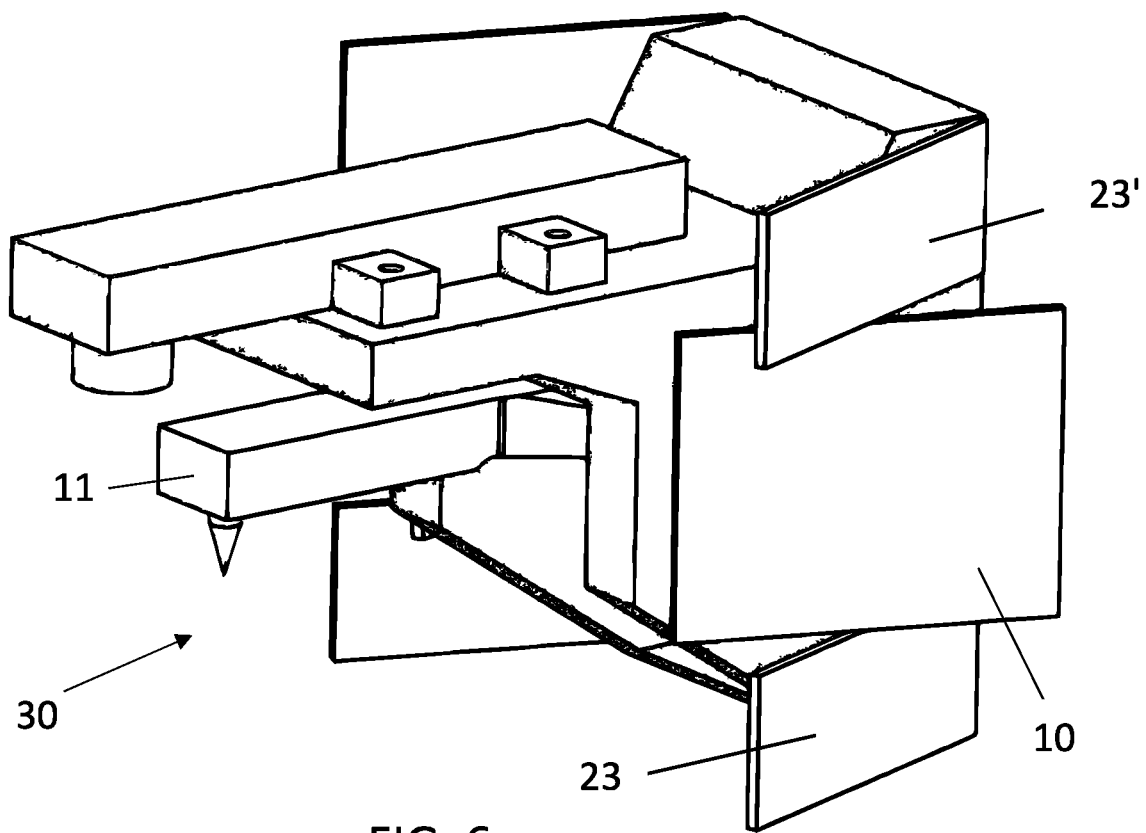
FIG. 6 schematically shows a perspective view of a wire bonder in accordance with an embodiment of the present invention.

FIG. 6 schematically shows a perspective view of a wire bonder 30 in accordance with an embodiment of the present invention. In this embodiment, each hinge comprises three leaf-springs 23, 24, 23' with portions of these being visible, and it can be seen that the heights of the leaf-springs 23, 24, 23' are distributed equally over the vertical extent of the hinge, with the height of the lowest leaf-spring 23 constituting 25% of the total height of the hinge, the height of the middle leaf-spring 24 constituting 50% of the total height of the hinge and the height of the uppermost leaf-spring 23' constituting 25% of the total height of the hinge. This type of arrangement provides balanced forces over the extent of the hinge. Bondhead 11 is mounted to the table, to move with the stage.

Figure 7:
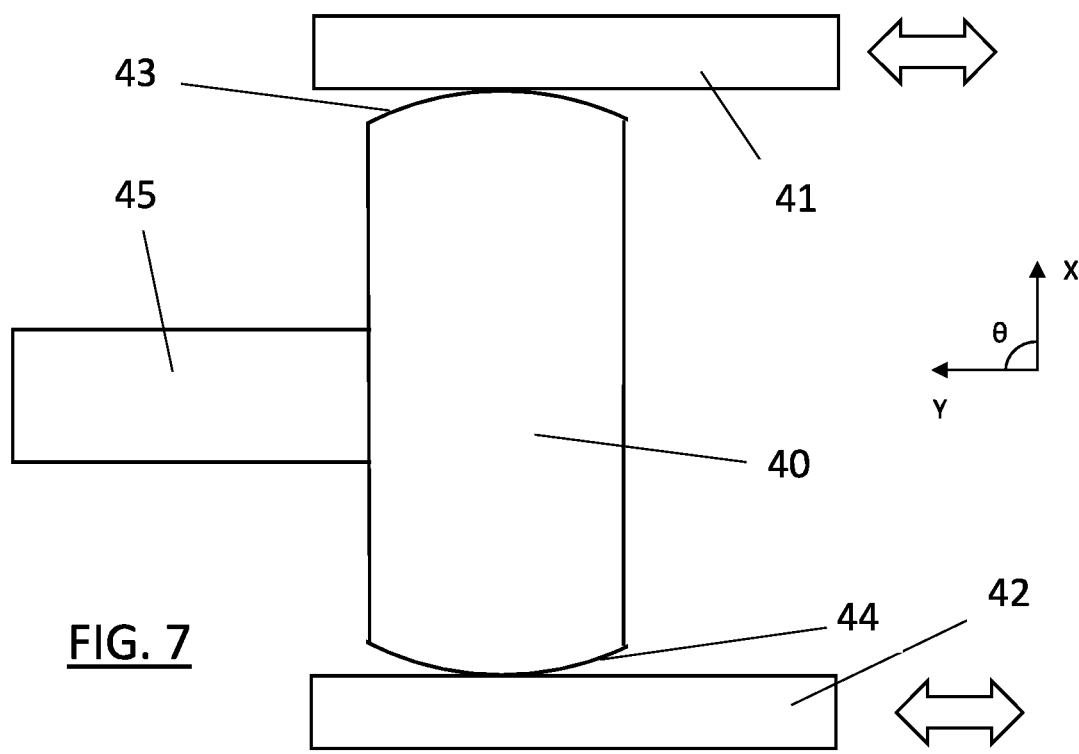
FIG. 7 schematically shows a Yθ table from above in accordance with another embodiment of the present invention.

FIG. 7 schematically shows a Yθ table from above in accordance with another embodiment of the present invention, with a bondhead 45 carried by a stage 40. Here, stage 40 frictionally engages with each of the two arms 41, 42. The edges 43, 44 of the stage 40 which engage with the arms 41, 42 are radially curved to permit rotation of the staged 40 when the arms 41, 42 move at different velocities along the Y-axis. So that the stage 40 may be fully supported by the arms 41, 42, it is necessary that there is high friction between the stage 40 and the arms 41, 42, so that the frictional forces are sufficient to overcome the downward forces acting on the stage 40. The stage 40 will therefore be firmly pressed or clamped therebetween. Friction between the stage 40 and arms 41, 42 is used to transfer the driving forces to the stage 40. If required, guiding rails (not shown) can be included to constrain the other degrees of freedom. In this embodiment, the constraint between the arms ensures that the rotary axis remains equidistant between the first and second arms 41, 42 throughout the entire possible ranges of motion.

In a related embodiment (not shown), the stage 40 may be carried by a wheel, and the wheel is pressed between the arms 41, 42 to enable the frictional driving thereof.

Figure 8:
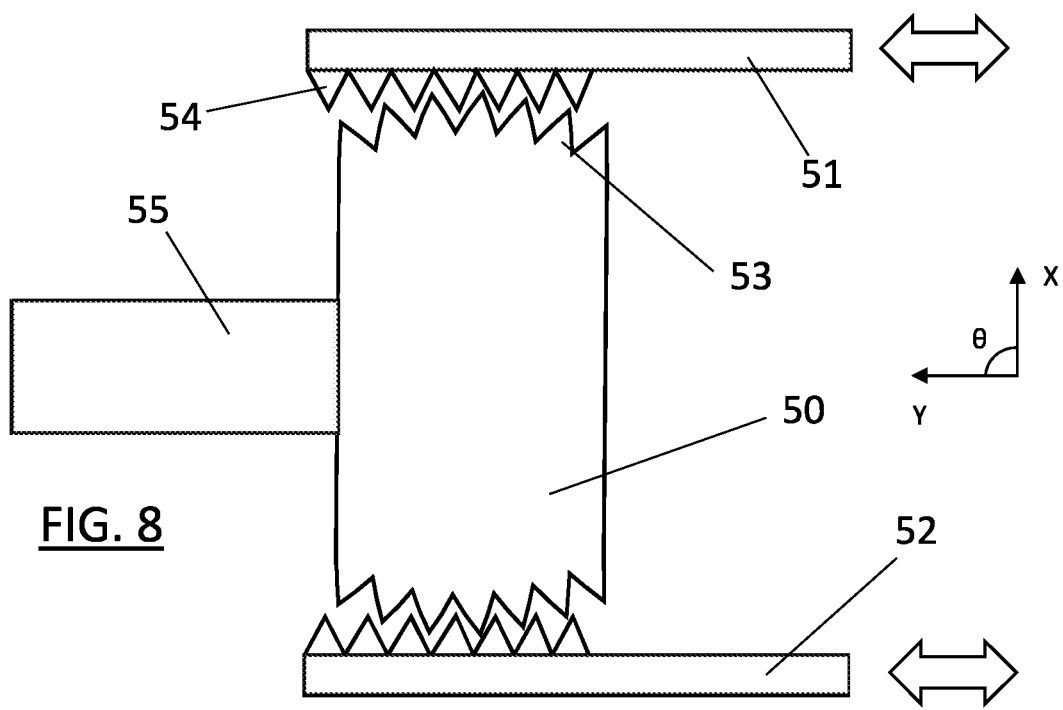
FIG. 8 schematically shows a Yθ table from above in accordance with a further embodiment of the present invention.

FIG. 8 schematically shows a Yθ table from above in accordance with a further embodiment of the present invention, with a bondhead 55 carried by a stage 50. Here, the arms 51, 52 each comprise toothed racks 54, which engage with toothed and radiused ends 53 of the stage 50, which act as pinions. The apparatus of this embodiment otherwise functions in a similar manner to that shown in FIG. 7.

Optionally, the rack and pinion system of FIG. 8 may comprise split gears for transferring driving forces from each toothed rack 54 to the stage 50.

If required, guiding rails (not shown) can be included to constrain the other degrees of freedom.

In a related embodiment (not shown), the stage 40 may be carried by a wheel, and the wheel comprises the pinion gearing for engagement with racks 54.

Figure 9:
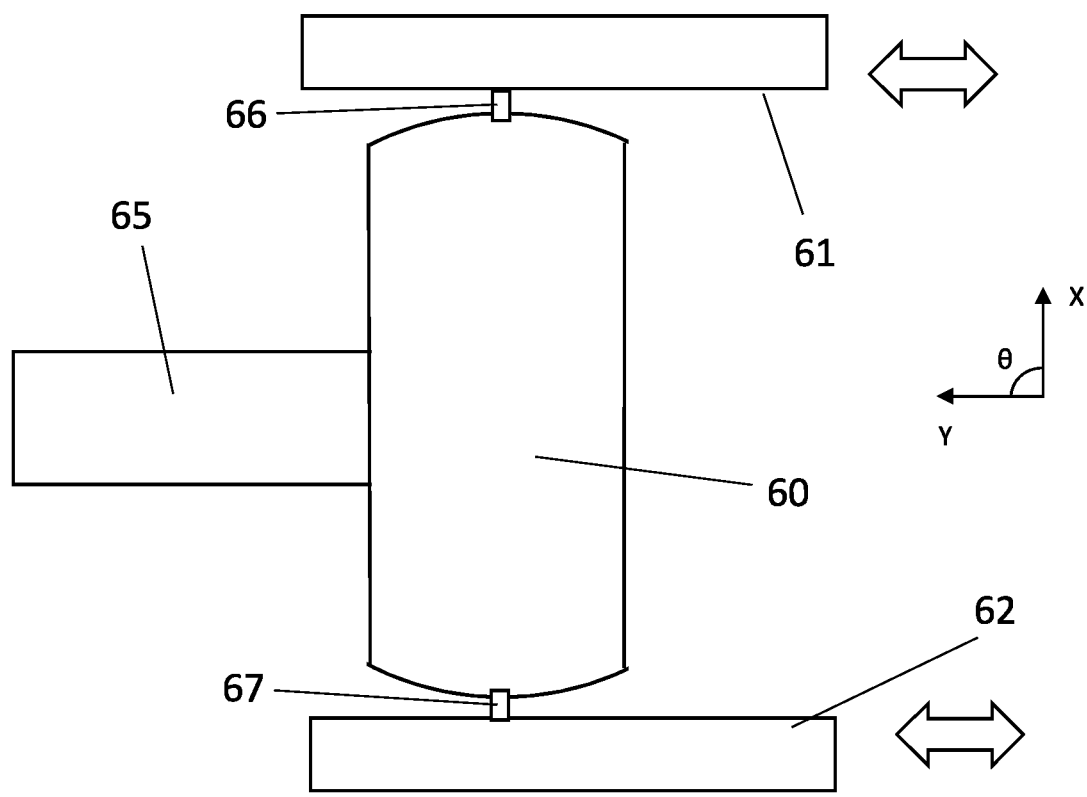
FIG. 9 schematically shows a Yθ table from above in accordance with an additional embodiment of the present invention.

FIG. 9 schematically shows a Yθ table from above in accordance with an additional embodiment of the present invention, with a bondhead 65 carried by a stage 60. In this embodiment, a respective elastic strip 66, 67 is connected between a radiused end of the stage 60 and adjacent arm 61, 62, to transfer motion from the arms 61, 62 to the stage 60. During rotation of the stage 60, i.e. when the arms 61, 62 move at different velocities along the Y-axis, the elastic strips 66, 67 stretch and are pressed between the stage 60 and the respective arm 61, 62.

In a related embodiment (not shown), the stage 60 may be carried by a wheel, and the elastic strip connects the wheel to a respective arm 61, 62.

The above-described embodiments are exemplary only, and other possibilities and alternatives within the scope of the invention will be apparent to those skilled in the art. For example, while the stage is preferably supported by the hinges alone, support may be provided by a separate bearing (for example located underneath the stage), or by a combination thereof.

For simplicity, the apparatus described above uses arms which are driven in parallel directions, however this is not essential, and it is only required that the arms are driven with a movement component along a direction parallel to the first (Y) axis. The arms themselves also need not be parallel to each other.

While the table has been described as being of utility for wire bonders, it could equally be used for other semiconductor equipment.

REFERENCE NUMERALS USED

10—wire bonder table
11—bondhead
12—stage
13, 14—arms
15, 16—bearings
17, 18—hinges
19, 20—beams
21, 22—pivots
23, 24—leaf-springs
25—reinforcement element
26—cross-pivot flexure
27—base
28—mounting element
30—wire bonder
40, 50, 60—stage
41, 42, 51, 52, 61, 62—arms
43, 44—radiused edges
45, 55, 65—bondhead
53—toothed edge
54—rack
66, 67—elastic strip
A—arbitrary point on stage
L1—shortest distance between the rotary axis and arm
L2, L3—distance between rotary axis and end of arm

The invention claimed is:

1. A positioning table for use in semiconductor equipment, comprising:
first and second arms, each of said first and second arms being independently drivable with a component of movement along a direction parallel to a first axis; and a stage, engaged with both the first and second arms;

wherein the stage is connected to each of the first and second arms via a respective engagement mechanism such that the stage is movable both linearly in a direction parallel to the first axis, and rotatably about a rotary axis being substantially orthogonal to the first axis, wherein each engagement mechanism comprises a respective hinge, wherein each hinge comprises first and second beams, and wherein each of said first and second beams is connected at a first end thereof to a respective arm of one of the first or second arms, and at a second, distal end thereof to the stage.

2. The positioning table of claim 1, further comprising:

first and second linear motors for linearly driving the first and second arms respectively;

wherein each engagement mechanism is configured to permit rotation of the stage relative to a respective linear motor in a such a way that a point A of the stage will move along the first axis (Y) as: $Y_A$=theta*R, where theta is an angle of rotation of the stage about the rotary axis in radians and R is a distance between a center of the engagement mechanism and point A.

3. The positioning table of claim 1, wherein each engagement mechanism is configured to permit a respective distance between the rotary axis and an end of each of the first and second arms to vary during driving of an arm along the direction parallel to the first axis.

4. The positioning table of claim 1, wherein the stage is linearly movable along the first axis when the first and second arms are driven in the same direction along the first axis.

5. The positioning table of claim 1, wherein the stage is rotatably movable about the rotary axis when the arms are driven at different velocities along the first axis.

6. The positioning table of claim 1, wherein the stage is connected to the first and second arms at diametrically opposed sections of the stage.

7. The positioning table of claim 1, wherein the first and second beams of each hinge are arranged in a crossed configuration, such that the first and second beams are non-parallel and have adjacent, overlying portions.

8. The positioning table of claim 7, wherein each beam is non-flexible and has a discrete pivot at each end, such that the hinge comprises a four-bar linkage.

9. The positioning table of claim 7, wherein each beam comprises a flexure element, such that the hinge comprises a cross-pivot flexure.

10. The positioning table of claim 9, wherein each flexure element comprises a leaf-spring.

11. The positioning table of claim 10, wherein each leaf-spring comprises a reinforcement element located at a midsection of the respective leaf-spring, for increasing the rigidity of the respective leaf-spring.

12. The positioning table of claim 1, comprising first and second actuators, for respectively driving the first and second arms along the first axis.

13. A wire bonder comprising the positioning table of claim 1, and a bondhead mounted on the stage of the table.

14. A wire bonder, comprising:

first and second arms, each of said first and second arms being independently drivable with a component of movement along a direction parallel to a first axis; and a stage, engaged with both the first and second arms;

wherein the stage is connected to each of the first and second arms via a respective engagement mechanism such that the stage is movable both linearly in a direction parallel to the first axis, and rotatably about a rotary axis being substantially orthogonal to the first axis, wherein each engagement mechanism comprises a respective hinge, wherein each hinge comprises first and second beams, and wherein each of said first and second beams is connected at a first end thereof to a respective arm of one of the first or second arms, and at a second, distal end thereof to the stage.

* * * * *